(12) United States Patent
Gilbert et al.

(10) Patent No.: US 6,709,875 B2
(45) Date of Patent: Mar. 23, 2004

(54) CONTAMINATION CONTROL FOR EMBEDDED FERROELECTRIC DEVICE FABRICATION PROCESSES

(75) Inventors: Stephen R. Gilbert, San Francisco, CA (US); Trace Q. Hurd, Plano, TX (US); Laura W. Mirkarimi, Sunol, CA (US); Scott Summerfelt, Garland, TX (US); Luigi Colombo, Dallas, TX (US)

(73) Assignees: Agilent Technologies, Inc., Palo Alto, CA (US); Texas Instruments, Inc., Dallas, TX (US)

( * ) Notice: Subject to any disclaimer, the term of this patent is extended or adjusted under 35 U.S.C. 154(b) by 0 days.

(21) Appl. No.: 09/925,201

(22) Filed: Aug. 8, 2001

(65) Prior Publication Data

US 2003/0036209 A1 Feb. 20, 2003

(51) Int. Cl.$^7$ .................................................. H01G 7/06
(52) U.S. Cl. ............................................. 438/3; 438/240
(58) Field of Search ................................ 438/3, 240, 238, 438/351, 250–253, 393–395

(56) References Cited

U.S. PATENT DOCUMENTS

| | | | |
|---|---|---|---|
| 5,258,093 A | * | 11/1993 | Maniar ........................ 206/236 |
| 5,536,672 A | | 7/1996 | Miller et al. |
| 5,773,314 A | | 6/1998 | Jiang et al. |
| 5,807,774 A | | 9/1998 | Desu et al. |
| 6,051,858 A | | 4/2000 | Uchida et al. |
| 6,080,529 A | | 6/2000 | Ye et al. |
| 6,114,254 A | | 9/2000 | Rolfson |
| 6,140,672 A | * | 10/2000 | Arita et al. ................... 257/295 |
| 6,174,735 B1 | | 1/2001 | Evans |
| 6,255,228 B1 | * | 7/2001 | Rolfson .................... 427/126.1 |
| 6,261,892 B1 | * | 7/2001 | Swanson ..................... 438/238 |

* cited by examiner

Primary Examiner—Jey Tsai

(57) ABSTRACT

A ferroelectric device fabrication process is described in which ferroelectric device contaminant substances (e.g., Pb, Zr, Ti, and Ir) that are incompatible with standard CMOS fabrication processes are tightly controlled. In particular, specific etch chemistries have been developed to remove incompatible substances from the backside and edge surfaces of the substrate after a ferroelectric device has been formed. In addition, a sacrificial layer may be disposed over the bottom and edge surfaces (and, in some embodiments, the frontside edge exclusion zone surface) of the substrate to assist in the removal of difficult-to-etch contaminants (e.g., Ir). In this way, the ferroelectric device fabrication process may be integrated with a standard semiconductor fabrication process, whereby ferroelectric devices may be formed together with semiconductor integrated circuits without substantial risk of cross-contamination through shared equipment (e.g., steppers, metrology tools, and the like).

16 Claims, 7 Drawing Sheets

CONTAMINATION CONTROL FOR EMBEDDED FERROELECTRIC DEVICE FABRICATION PROCESSES

CROSS-REFERENCE TO RELATED APPLICATIONS

This application relates to co-pending U.S. patent application Ser. No. 09/925,223, filed Aug. 8, 2001, by Stephen R. Gilbert et al., and entitled "Forming Ferroelectric Pb(Zr, Ti)O$_3$ Films," which is incorporated herein by reference.

TECHNICAL FIELD

This invention relates to systems and methods of controlling contamination during fabrication of embedded ferroelectric devices.

BACKGROUND

Today, several trends exist in the semiconductor device fabrication industry and the electronics industry that are driving the development of new material technologies. First, devices, such as personal handheld devices (e.g., cellular telephones and personal digital assistants) are continuously getting smaller and smaller and requiring less and less power. Second, in addition to being smaller and more portable, such devices are requiring more computational power and on-chip memory. In light of these trends, there is a need in the industry to provide a computational device that has a fair amount of memory and logic functions integrated onto the same semiconductor chip. Preferably, this computation device will include a non-volatile memory so that if the battery dies, the contents of the memory will be retained. Examples of conventional non-volatile memories include electrically erasable, programmable read only memories ("EEPROM") and flash EEPROMs. Table 1 illustrates the differences between different memory types.

A ferroelectric memory (FeRAM) is a non-volatile memory that utilizes a ferroelectric material (e.g., SrBi$_2$Ta$_2$O$_9$ (SBT) or Pb(Zr,Ti)O$_3$ (PZT)) as a capacitor dielectric that is situated between a bottom electrode and a top electrode. In general, ferroelectric memory elements are non-volatile because of the bistable polarization state of the material. In addition, ferroelectric memory elements may be programmed with relatively low voltages (e.g. less than 5 volts) and are characterized by relatively fast access times (e.g. less than 40 nanoseconds) and operational robustness over a large number of read and write cycles. These memory elements also consume relatively low power, may be densely packed, and exhibit radiation hardness.

TABLE 1

| Property | SRAM | Flash | DRAM | FeRAM (Demo) |
| --- | --- | --- | --- | --- |
| Voltage | >0.5 V | Read >0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | >10$^{15}$ | <10$^5$ | >10$^{15}$ | >10$^{13}$ |
| Read Time (single/multi bit) | <10 ns | <30 ns | <30 ns/<2 ns | 60 ns |
| Read Endurance | >10$^{15}$ | >10$^{15}$ | >10$^{15}$ | >10$^{13}$ |
| Added Mask for embedded | 0 | ~6–8 | ~6–8 | ~3 |
| Cell Size (F~metal pitch/2) | ~80 F$^2$ | ~8 F$^2$ | ~8 F$^2$ | ~18 F$^2$ |
| Architecture | NDRO | NDRO | DRO | DRO |
| Non volatile | NO | YES | NO | YES |
| Storage | I | Q | Q | P |

TABLE 1-continued

To integrate ferroelectric capacitors with standard complimentary metal oxide semiconductor (CMOS) device technology, several new materials with non-standard metal constituents must be introduced into the Si wafer fabrication facility. Among the materials that are needed to fabricate a typical ferroelectric capacitor stack are PZT or SBT dielectrics, along with one or more of the following electrode materials: Ir, Ru, or Pt. Some of the metals present in these materials, such as Ti, Ta, and Pt, are used in mainstream Si wafer fab lines. Other metals, such as Pb, Zr, Sr, Bi, Ru, and Ir, conventionally are not introduced into Si manufacturing flows. Accordingly, little is known regarding the effect of these materials on the yield, reliability, and electrical performance of CMOS-based devices. Moreover, despite the fact that front-end technology requirements for wafer surface processing stipulate concentrations less than 9×10$^9$ atoms/cm$^2$ for known critical metals such as Cu at the 180 nm technology node, precise limits for the FeRAM-related metal contaminants have not been quantified.

SUMMARY

In general, the invention relates to the creation of ferroelectric capacitors in a FeRAM process module that occurs between a front-end process module (that includes, e.g., logic and contact processes) and a backend process module (that includes, e.g., mostly metallization processes). The FeRAM process module should be compatible with the front-end process flow including the use of W contacts, which currently are standard in most logic flows, as the bottom contact of the capacitor. The FeRAM thermal budget also should be low enough that it does not impact low resistance structures in the front end (such as tungsten plugs and silicided source/drains and gates) that are used in most logic devices. In addition, since transistors and other front-end devices (e.g., diodes) are sensitive to contamination, the FeRAM process module should not contaminate such devices either directly (e.g., by diffusion in chip) or indirectly (e.g., by cross contamination through shared equipment). The FeRAM devices and process module also should be compatible with standard backend process flows. Accordingly, the FeRAM process module should not increase the resistance of the logic metallization and should not increase parasitic capacitances between metal and transistor. In addition, the FeRAM devices should not be degraded by standard backend process flows. This is a significant challenge since ferroelectric capacitors have been shown to be sensitive to hydrogen-induced degradation and most logic backend processes use hydrogen or deuterium (e.g. SiO$_2$, Si$_3$N$_4$, and CVD W deposition, SiO$_2$ via etch, and forming gas anneals).

With respect to contamination control, the level of contamination in substrates that are processed through shared equipment (e.g., steppers or metrology tools) should not be high enough to degrade device performance. Aside from processing errors, a primary route for cross-contamination is contact between wafer handling systems in shared tools and the backside, edge, and frontside edge exclusion zone surfaces of the substrate. In the case of a typical FeRAM process flow, two processes are expected to lead to the most severe contamination of the wafer backside and edge: (1) deposition of the PZT or SBT film, and (2) dry etching of the ferroelectric capacitor stack. Thus, in order to achieve the production efficiencies resulting from the use of shared equipment and shared process facilities, undesired elements should be removed from the substrate backside, edge, and frontside edge exclusion zone prior to the use of any shared process equipment.

In one aspect, the invention features a method of forming a ferroelectric device on a substrate having a top surface, a bottom surface, an edge and a frontside edge exclusion zone. In accordance with this method, a bottom electrode is formed over the top surface of the substrate. A ferroelectric dielectric layer is formed over the bottom electrode. A top electrode is formed over the ferroelectric dielectric layer. To control contamination, ferroelectric device material (e.g., ferroelectric-related contamination, such as Pb, Zr, Ti, and electrode-related contamination, such as Ir) is etched selectively from the substrate bottom surface and edge.

Embodiments of the invention may include one or more of the following features.

Ferroelectric device material preferably is etched selectively from the substrate bottom surface and edge with an etchant comprising an acid containing fluorine or an acid containing chlorine, or both. In one embodiment, the etchant includes a mixture of $NH_4F$ and HCl. The etchant may include a $NH_4F$:HCl volume ratio of about 1.6. The etchant may further include a diluent (e.g., $H_2O$). In one embodiment, the etchant comprises a $NH_4F$:HCl:$H_2O$ volume ratio of about 1:1.6:x, wherein x preferably has a value ranging from about 20 to about 1,000 and, more preferably, has a value ranging from about 40 to about 100.

In other embodiments, ferroelectric device material is etched selectively from the substrate bottom surface, edge and frontside edge exclusion zone with an etchant comprising a mixture selected from the following: HCl and $H_2O$; HF and $H_2O$; $HNO_3$ and $H_2O$; HF, HCl and $H_2O$; $NH_4F$, HCl, $HNO_3$ and $H_2O$; HF, HCl, $HNO_3$ and $H_2O$; and HF, $H_2O_2$, $HNO_3$ and $H_2O$.

Ferroelectric device material also may be etched selectively from the substrate frontside edge exclusion zone.

In some embodiments, the substrate comprises a sacrificial layer disposed over the bottom surface and the edge of the substrate. The sacrificial layer may include silicon nitride or silicon dioxide. The sacrificial layer may be etched with an etchant comprising fluorine (e.g., HF). The sacrificial layer may extend over the frontside edge exclusion zone of the substrate. The sacrificial layer preferably is etched after a ferroelectric capacitor structure has been formed.

In another aspect, the invention features a ferroelectric device process module that includes one or more dedicated process tools, one or more shared process tools, and one or more cleaning stations. The dedicated process tools are allocated for only ferroelectric device processing. The shared process tools are allocated for both ferroelectric device processing and standard semiconductor device processing. The cleaning stations are configured for cleaning ferroelectric device contamination from substrates before the substrates are transferred from a dedicated process tool to a shared process tool.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
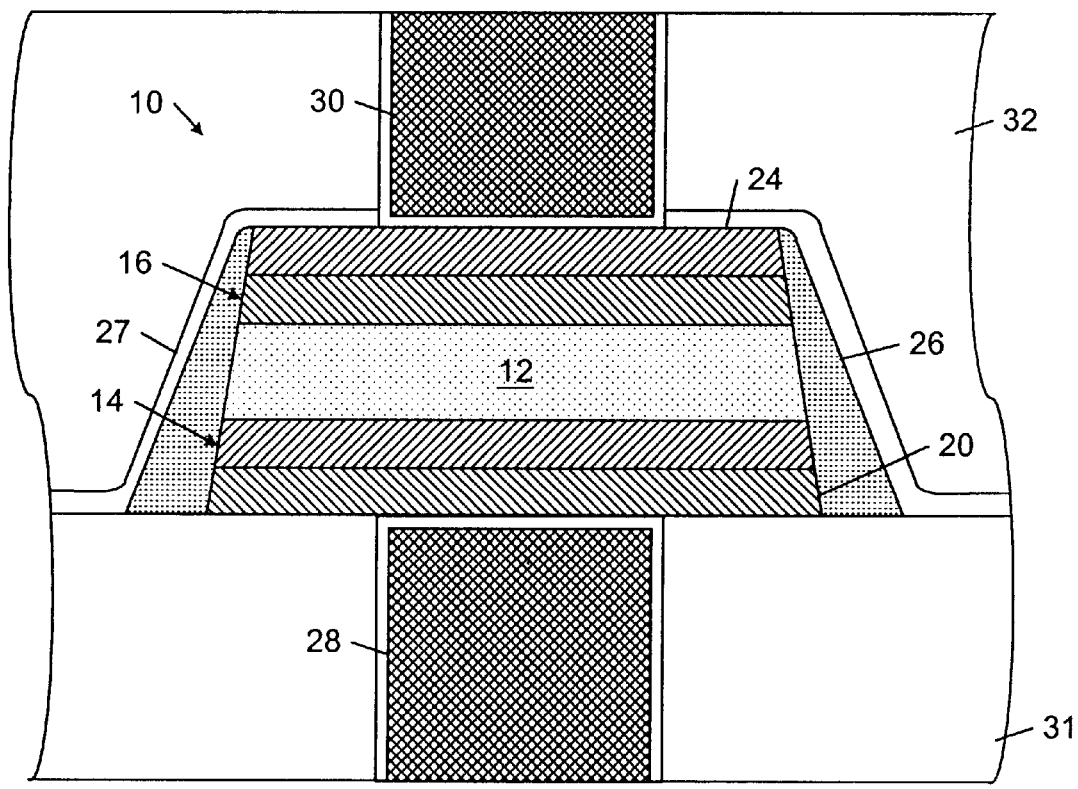
FIG. 1 is a diagrammatic cross-sectional side view of a FeRAM capacitor coupled between a pair of conductive plugs that are disposed through respective interlayer dielectric layers.

Referring to FIG. 1, in one embodiment, an integrated circuit ferroelectric capacitor 10 includes a dielectric PZT film 12 formed between a multilayer bottom electrode 14 and a multilayer top electrode 16. PZT film 12 may be formed by the chemical vapor deposition process described in U.S. patent application Ser. No. 09/925,223, filed Aug. 8, 2001, by Stephen R. Gilbert et al., and entitled "Forming Ferroelectric Pb(Zr, Ti)$O_3$ Films." Bottom electrode 14 includes Ir/JrO$_x$ conductive layers and a TiAlN conductive, oxidation-resistant diffusion barrier layer 20, and top electrode 16 includes IrO$_x$/Ir conductive layers and a TiAlN hardmask/conductive diffusion barrier layer 24. In other embodiments, the Ir/IrO$_x$ conductive layers and the conductive diffusion barrier layers 20, 24 may be formed from different materials. Ferroelectric capacitor 10 also includes an aluminum oxide ($Al_2O_3$) sidewall diffusion barrier 26 and an overlying silicon nitride etch stop layer 27. In this embodiment, ferroelectric capacitor 10 is coupled between a pair of conductive plugs 28, 30 that are formed in vias extending through a pair of interlayer dielectric layers 31, 32, respectively. Conductive plugs 28, 30 may be formed from an electrically conductive material, such as tungsten or polysilicon. In other embodiments, ferroelectric capacitor 10 may be formed on a silicon wafer, gallium arsenide, magnesium oxide, sapphire, or the top surface of a multilayer structure that includes, for example, a complex integrated circuit that is formed on a semiconductor wafer.

Figure 2A:
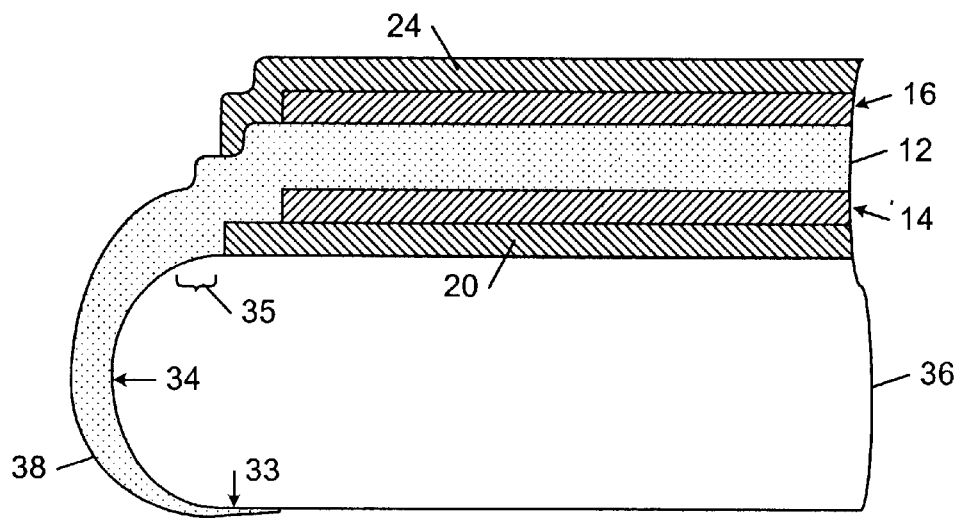
FIG. 2A is a diagrammatic cross-sectional side view of a FeRAM capacitor layer stack that is formed over a substrate.
Figure 2B:
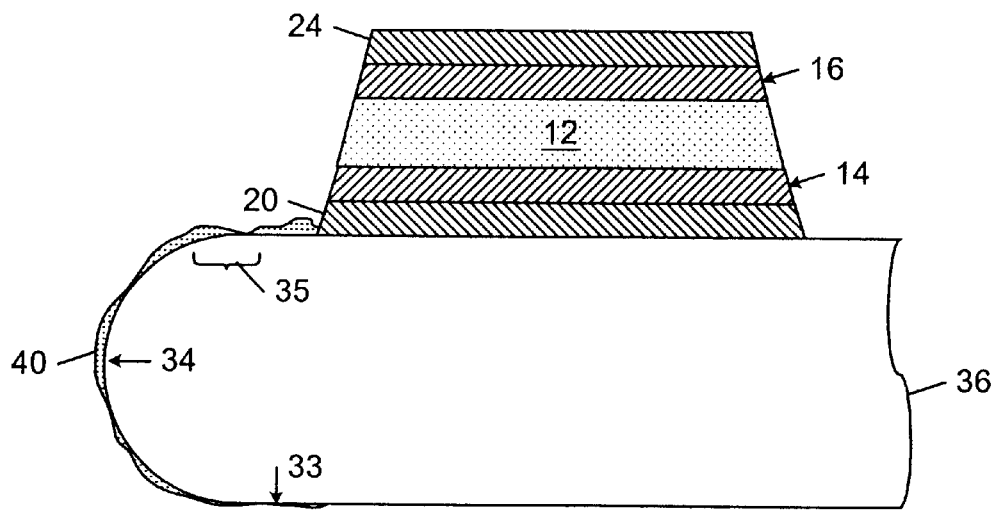
FIG. 2B is a diagrammatic cross-sectional side view of a FeRAM capacitor that is formed by etching the capacitor layer stack of FIG. 2A.

As shown in FIGS. 2A and 2B, during the formation of ferroelectric capacitor 10, constituent ferroelectric device substances (e.g., ferroelectric-related contamination, such as Pb, Zr, Ti, and electrode-related contamination, such as Ir) may migrate or otherwise form on a backside surface 33, an edge surface 34 and a frontside edge exclusion zone surface 35 of a substrate 36. (The frontside edge exclusion zone is an area around the peripheral edge of the substrate frontside that is designated to be free of film deposits.) Substrate 36 may include a logic level with one or more semiconductor devices and an overlying interlevel dielectric layer with one or more contact plugs extending therethrough. During the CVD fabrication of PZT dielectric layer 12, ferroelectric device material 38 may form on the backside, edge and frontside edge exclusion zone surfaces 33–35 of substrate 36 (FIG. 2A). In addition, after capacitor 10 has been formed, etch residues 40 may remain adhered to the backside, edge and frontside edge exclusion zone surfaces 33–35 of the substrate (FIG. 2B). The constituent capacitor layer substances and etch residues generally are incompatible with standard semiconductor device fabrication processes (e.g., an industry standard CMOS device fabrication process). Such contaminants may diffuse into critical regions of semiconductor devices and degrade the electrical properties of these critical regions. For example, Ir may diffuse into silicon substrates and degrade minority carrier lifetimes, and Pb may diffuse into gate oxide regions and degrade the gate oxide charge to breakdown.

As explained in detail below, ferroelectric capacitor 10 is formed by a ferroelectric device fabrication process (or process module) in which contaminant substances (e.g., Pb, Zr, Ti, and Ir) that are incompatible with standard CMOS fabrication processes are tightly controlled. In particular, specific etch chemistries have been developed to remove incompatible substances from the backside, edge and frontside edge exclusion zone surfaces of the substrate during formation of ferroelectric capacitor 10. In addition, a sacrificial layer may be disposed over the bottom, top and edge surfaces of the substrate to assist in the removal of difficult-to-etch contaminants (e.g., Ir). Process control methodologies also have been developed to reduce cross-contamination between the ferroelectric device process module and the front-end and backend semiconductor device process modules. In this way, the ferroelectric device fabrication process may be integrated with an industry standard semiconductor fabrication process, whereby capacitor 10 may be formed together with a semiconductor integrated circuit without substantial risk of cross-contamination through shared equipment (e.g., steppers, metrology tools, and the like).

Figure 3:
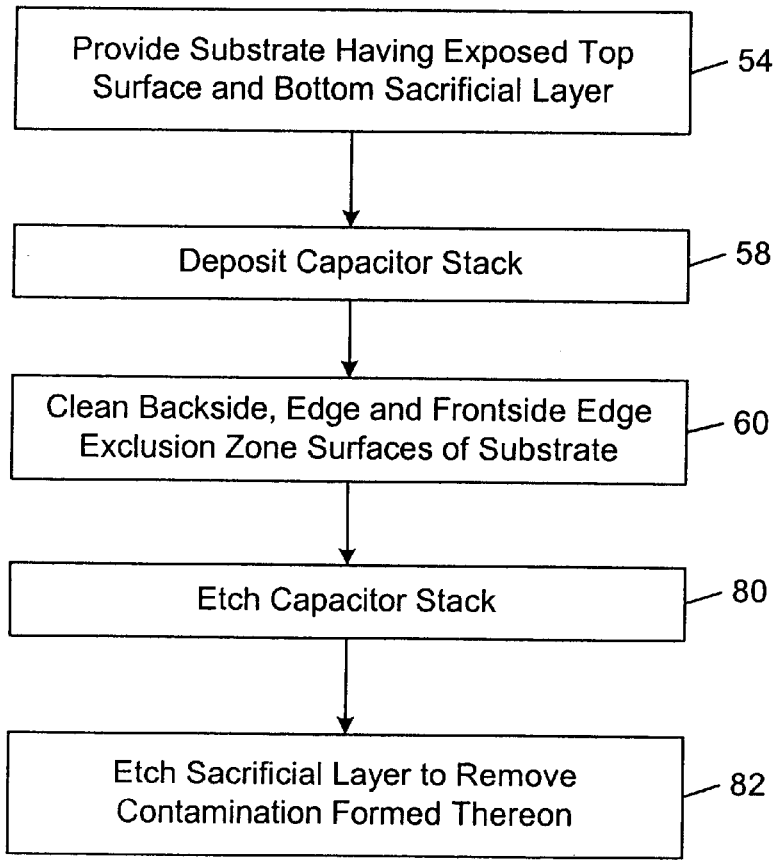
FIG. 3 is a flow diagram of a method of forming a ferroelectric device.
Figure 4:
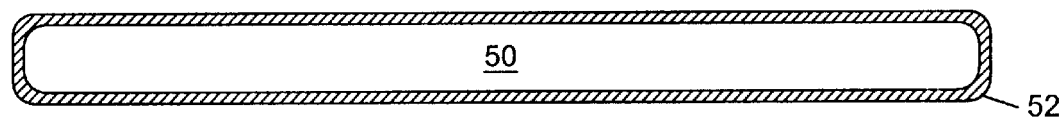
FIG. 4 is a diagrammatic cross-sectional side view of a substrate with sacrificial layer disposed over the top, bottom and edge surfaces of the substrate.

Referring to FIGS. 3, 4, 5, 6, 7, 8, 9 and 10, and initially to FIGS. 3 and 4, ferroelectric capacitor 10 may be formed as follows.

As shown in FIG. 4, in one embodiment, a substrate 50 having a sacrificial layer 52 disposed over top, bottom and edge surfaces is provided (step 54). Substrate 50 may be a semiconductor wafer (e.g., a silicon wafer) that includes a logic level with one or more semiconductor devices and an overlying interlevel dielectric layer with one or more contact plugs extending therethrough. Sacrificial layer 52 may be a silicon nitride layer or a silicon dioxide layer that may be formed, for example, by a conventional furnace process during the logic level or contact plug fabrication processes. In general, sacrificial layer 52 should assist the removal of contaminants (e.g., Pb, Zr, Ti and Ir) from the edge and backside of substrate 50, for example, by a lift-off process. In addition, sacrificial layer 52 should prevent diffusion of contaminants into substrate 50, where they may degrade the electrical properties of critical device regions.

Some other embodiments may not include a sacrificial layer.

Figure 5:
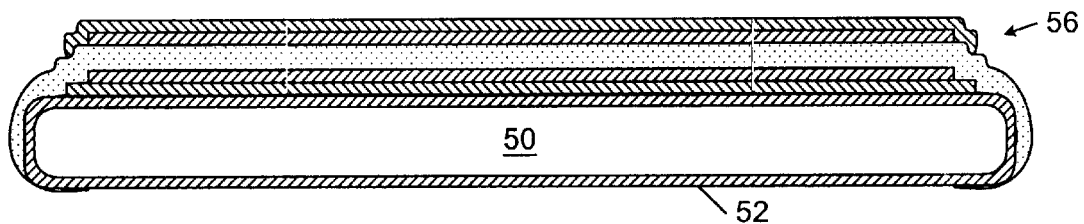
FIG. 5 is a diagrammatic cross-sectional side view of a capacitor layer stack formed over the substrate of FIG. 4.

Referring to FIG. 5, a ferroelectric capacitor stack 56 is deposited over the top surface of substrate 50 (step 58). Ferroelectric capacitor stack 56 may have the same electrode and dielectric layers as ferroelectric capacitor 10.

Figure 6:
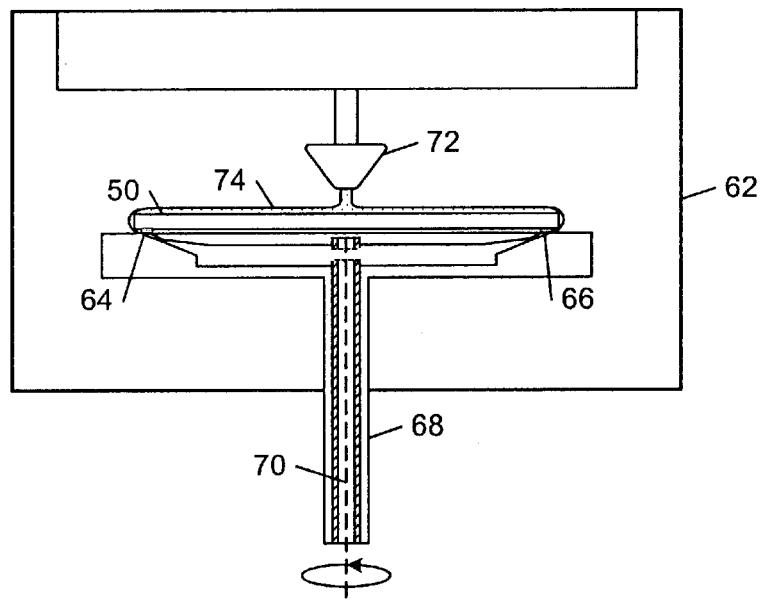
FIG. 6 is a diagrammatic cross-sectional side view of a substrate cleaning apparatus applying an etchant to the backside, edge and some portion of the frontside edge exclusion zone of the substrate of FIG. 5.
Figure 7:
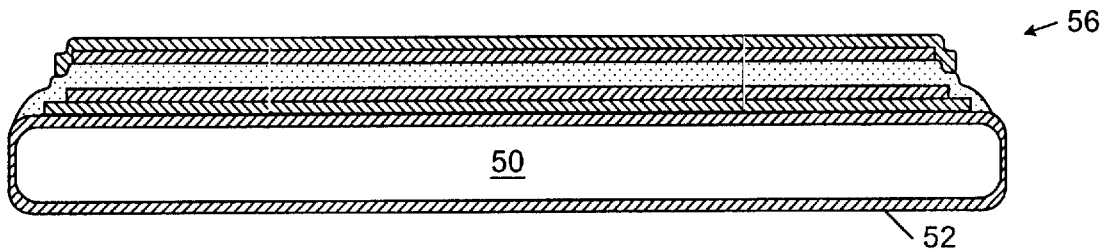
FIG. 7 is a diagrammatic cross-sectional side view of the capacitor layer stack of FIG. 5 after the backside of the substrate has been cleaned by etching.

As shown in FIGS. 6 and 7, ferroelectric device material 38 and other contaminants may be cleaned from the backside, edge and frontside exclusion zone surfaces of substrate 50 by a wet etch process (step 60). In particular, substrate 50 may be placed within an automated cleaning station 62 (e.g., an automated substrate cleaner that is available from SEZ Semiconductor-Equipment Zubehoer Fuer die Halbleiterfertigung Gesellschaft m.b.H of Kaernten, Austria). Cleaning station 62 includes an annular support 64 that is configured to hold substrate 50. A vacuum is generated under substrate 50 by the efflux of a pressurized gas (e.g., nitrogen gas) through a ring nozzle 66. The pressurized gas is delivered to ring nozzle 66 through a gas conduit defined in a shaft 68 that is configured to rotate about an axis 70. Cleaning station 62 also includes a nozzle 72 that is configured to dispense an etching solution 74 over the exposed surface of substrate 50. The thickness and uniformity of the etching solution that forms over the exposed surfaces of substrate 50 is determined, at least in part, by the etching solution flow rate through nozzle 72 and the rate at which substrate 50 is rotated. In operation, substrate 50 is placed face down onto support 64 and pressurized gas is ejected from ring nozzle 66 to create a vacuum that holds substrate 50 in place. While substrate 50 is rotated about axis 70, etching solution 74 is dispensed from nozzle 72 to form a substantially uniform film over the exposed backside, edge and frontside edge exclusion zone surfaces of substrate 50. After the backside, edge and frontside edge exclusion zone surfaces of substrate 50 have been cleaned, the substrate is dried by rotation.

In some embodiments, a protective photoresist layer may be disposed over ferroelectric capacitor stack 56 before substrate 50 is placed within cleaning station 62. In addition, in some embodiments, ferroelectric device material may be cleaned from the backside, edge and frontside edge exclusion zone surfaces by a bath etch process.

As shown in FIG. 7, the resulting backside, edge and frontside edge exclusion zone surfaces of substrate 50 are substantially free of contamination that may have formed during the formation of ferroelectric capacitor 10. In general, etching solution 74 should remove all ferroelectric device material contamination (e.g., Pb, Zr, Ti and Ir). Preferably, etching solution 74 also should remove ferroelectric device contamination such that remaining surface concentrations of, for example, Pb, Zr, Ti and Ir, are on the order of $10^{10}$ cm$^2$, or less. In addition, etching solution 74 should not attack the protective photoresist layer disposed over capacitor stack 56 (if present). In a preferred embodiment, etching solution 74 operates effectively at room temperature.

In one embodiment, etching solution 74 includes NH$_4$F, HCl and H$_2$O in a volume ratio of 1:1.6:x, where x has a value ranging from 1 to 1,000. This etch chemistry is highly selective for PZT. For example, a $NH_4F:HCl:H_2O$ volume ratio of 1:1.6:20 produced the following etch rates with respect to the constituent capacitor stack and sacrificial layer materials:

TABLE 2

| Layer Material | Etch Rate (nm/second) |
|---|---|
| PZT | ~70 |
| $Si_3N_4$ | ~2.2 |
| $SiO_2$ | ~0.1 |
| Si | ~0 |
| TiAlN | ~0 |
| Ir | ~0 |

Figure 8:
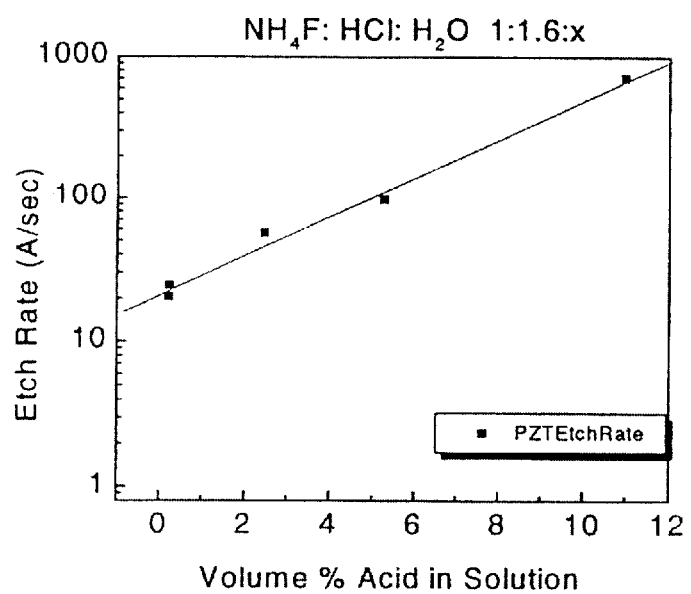
FIG. 8 is a graph of PZT etch rate for an etch chemistry of $NH_4F$, HCl and $H_2O$ plotted as a function of volume percent of acid in solution.

As shown in FIG. 8, the PZT etch rate of the $NH_4F:HCl:H_2O::1:1.6:x$ etching solution decreases with the volume percent of acid in solution and follows a semi-log plot. For example, based upon etches of 250 nm thick PZT films, an etch ratio of 1:1.6:20 yields a PZT etch rate of 70 nm/sec, an etch ratio of 1:1.6:40 yields a PZT etch rate of 10 nm/sec, whereas a PZT etch ratio of 1:1.6:100 yields an etch rate of 5.5 nm/sec. Based on this data, etch ratios between about 1:1.6:40 and 1:1.6:100 are preferred for achieving controllable PZT etch rates. Within this etch ratio range, the etch rates of $SiO_2$ and $Si_3N_4$ are significantly lower than 0.1 nm/sec and 2.2 nm/sec, respectively.

Without being limited to a particular theory, it is believed that the selectivity of the $NH_4F$, HCl and $H_2O$ etch chemistry is achieved by the combined action of the fluorine and the chlorine in the etching solution. In particular, it is believed that the fluorinated portion of the etching solution dissolves $ZrO_2$ and $TiO_2$, and the chlorinated portion etches $PbO_2$. Thus, in this embodiment, the combination of HCl and $NH_4F$ results in an aggressive, selective PZT etch. Dilution of this etch with, for example, $H_2O$, produces an etch that is characterized by a high selectivity between PZT and Si, $SiO_2$, $Si_3N_4$ and TiAlN.

Other etch chemistries containing mixtures of a fluorine-based acid and a chlorine-based acid also may be used for etching solution 74.

In some embodiments, etching solution 74 may be implemented by one, or combinations of two or more, of the following etch chemistries:

(i) $HCl+H_2O$ (ii) $HF+H_2O$ (iii) $HNO_3+H_2O$ (iv) $HF+HCl+H_2O$ (v) $NH_4F+HCl+HNO_3+H_2O$ (vi) $HF+HCl+HNO_3+H_2O$ (vii) $HF+H_2O_2+HNO_3+H_2O$ Each of these etch chemistries selectively etches PZT. For example, etch chemistry (i) with a $HCl:H_2O$ etch ratio of 1:1 yields a PZT etch rate of 2.9 nm/sec, whereas etch chemistry (ii) with a $HF:H_2O$ etch ratio of 1:10 yields a PZT etch rate of 8.4 nm/sec. With respect to etch chemistry (vii), it is believed that $H_2O_2$ substantially prevents plating of Pb back onto substrate 50 by promoting the oxidation of Pb in solution.

Figure 9:
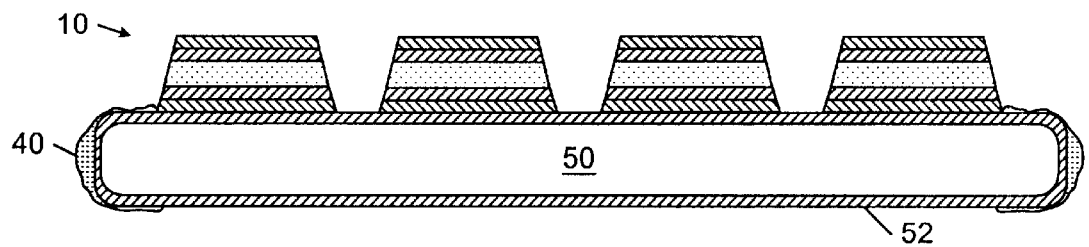
FIG. 9 is a diagrammatic cross-sectional side view of a plurality of ferroelectric capacitors formed by etching the capacitor layer stack of FIG. 7.

Referring to FIG. 9, after the backside, edge and frontside edge exclusion zone surfaces of substrate 50 have been cleaned (step 60), capacitor stack 56 is etched to form an array of ferroelectric capacitors 10 (step 80). Capacitor stack 56 may be etched using a conventional etching process.

Figure 10:
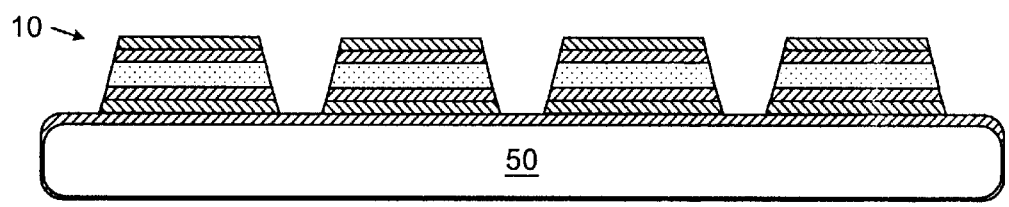
FIG. 10 is a diagrammatic cross-sectional side view of the ferroelectric capacitors of FIG. 9 after backside contamination has been removed by etching the sacrificial layer from the substrate bottom surface, edge and frontside edge exclusion zone.

As shown in FIG. 10, after capacitor stack 56 has been etched (step 80), sacrificial layer 52 may be etched to remove etch residue contamination 40 that may have formed on the exposed sacrificial layer surface during the capacitor stack etching process (step 80). In particular, Ir contaminants and other etch residues (e.g., Pb, Zr, Ti and organics) may be removed by lift-off as sacrificial layer 52 is dissolved in the selected etching solution. In general, the sacrificial layer etch chemistry should etch the material forming the sacrificial layer (e.g., $Si_3N_4$ or $SiO_2$) without attacking the underlying substrate material (e.g., Si). Preferably, the sacrificial layer etching solution also should remove etch residue contamination 40 such that the remaining surface concentrations of, for example, Pb, Zr, Ti, and Ir, are on the order of $10^{10}$ $cm^{-2}$, or less. In a preferred embodiment, the sacrificial layer etching solution operates effectively at room temperature. In some embodiments, the sacrificial layer etch chemistry is the same as the PZT etch chemistry. For example, an etch chemistry that includes a mixture of HF and $H_2O$ may be used for both the PZT etch and the sacrificial layer etch. In other embodiments, however, different etch chemistries may be used to accommodate, for example, different contaminant concentrations or different etch rate requirements. Other sacrificial layer etch chemistries that satisfy the above-described general guidelines also may be used. The sacrificial layer etch step may be performed in cleaning station 62 or in another suitable cleaning apparatus.

In some embodiments, after the sacrificial layer etch step, a portion of sacrificial layer 52 may remain disposed over the backside, edge and frontside edge exclusion zone surfaces of substrate 50.

Figure 11:
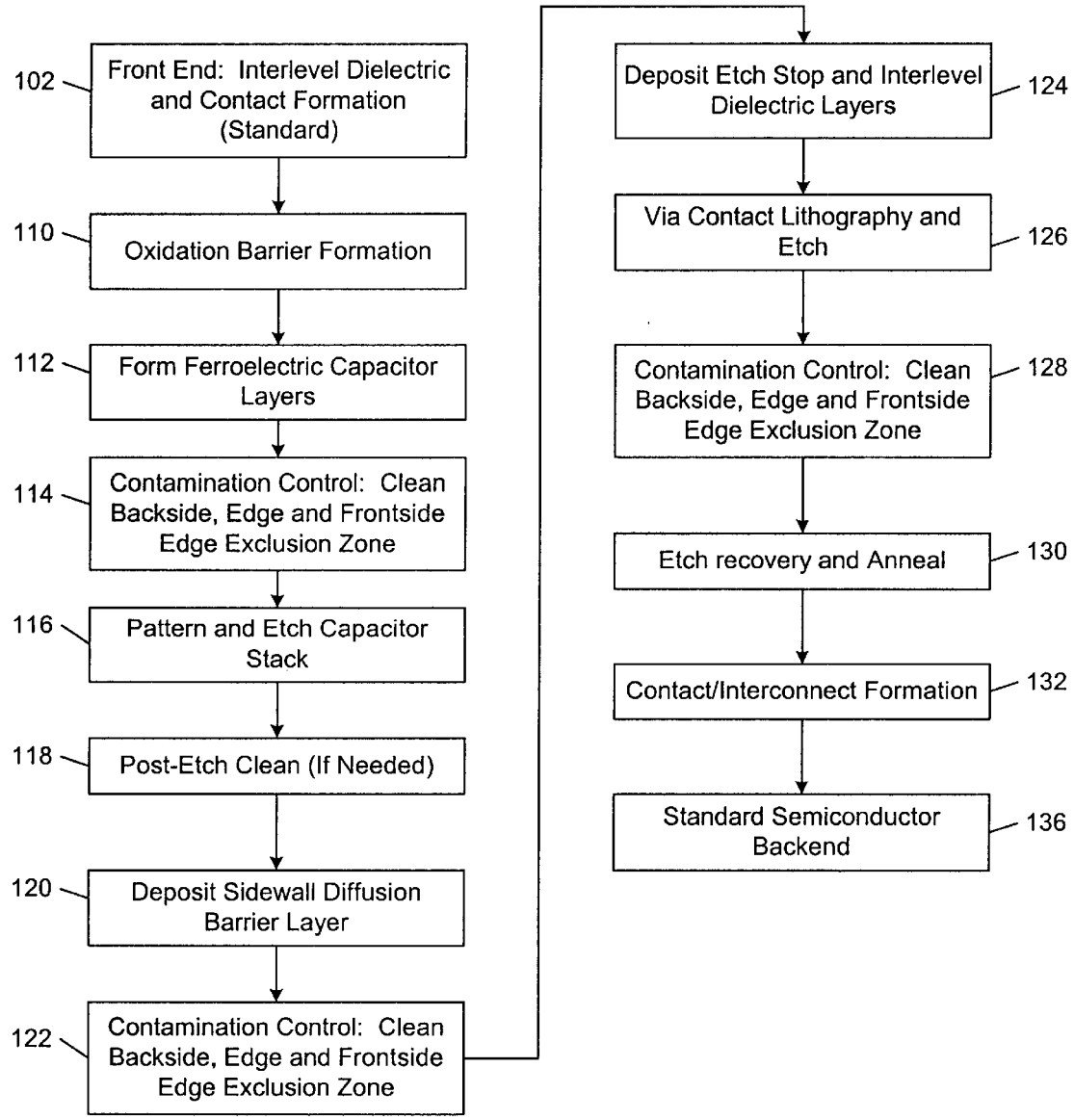
FIG. 11 is a flow diagram of an integrated ferroelectric device—integrated circuit fabrication process.
Figure 12:
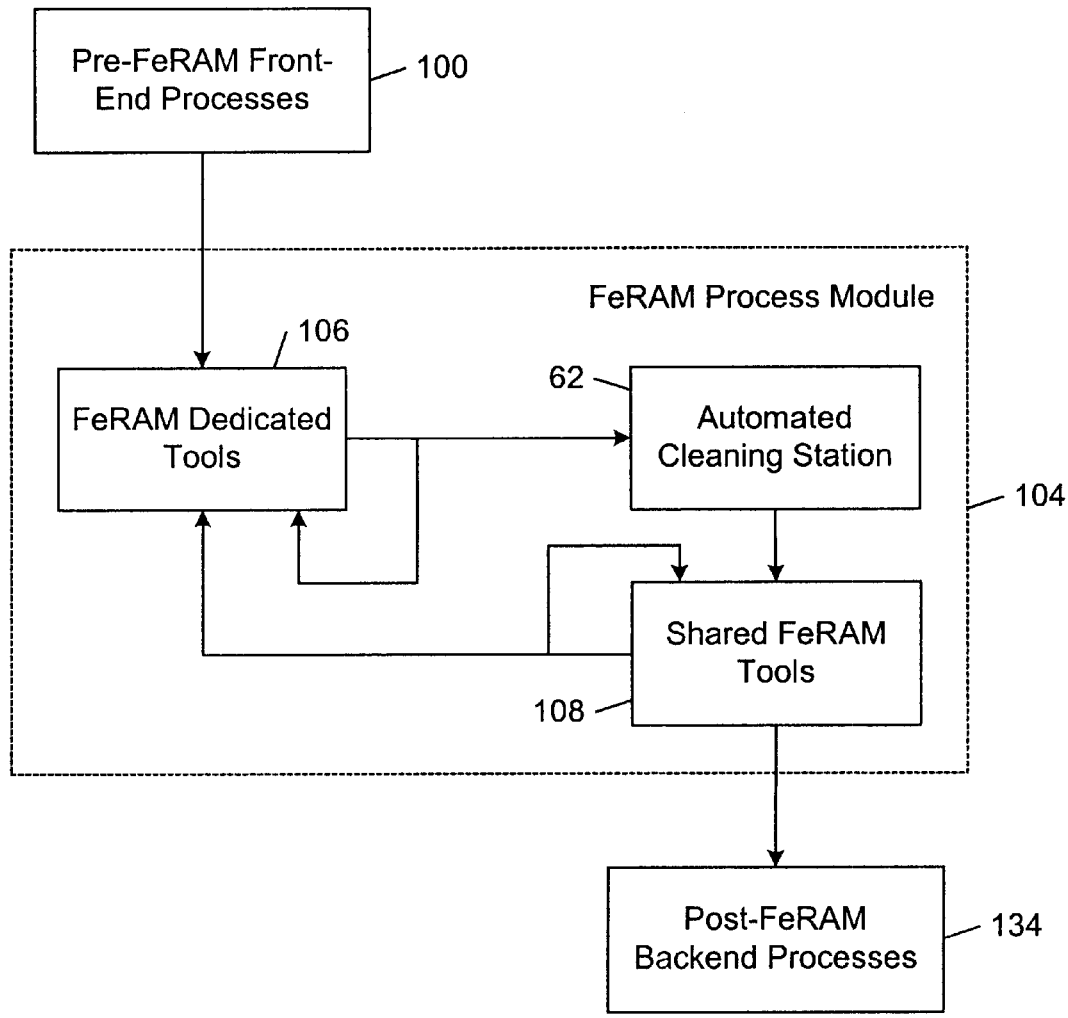
FIG. 12 is a block diagram of the process flow through FeRAM-dedicated and shared process tools of an FeRAM process module.

As shown in FIGS. 11 and 12, the above-described ferroelectric device fabrication process module readily may be integrated into a standard CMOS integrated circuit fabrication process. The logic and overlying interlevel dielectric layers and contacts may be formed on a substrate using conventional, industry standard front-end semiconductor processes 100 (step 102). Front-end processes may result in an $SiO_2$ or $Si_3N_4$ layer on the wafer frontside, backside and edge. In some embodiments, this layer may be used as the sacrificial layer for subsequent contamination control steps. Next, the ferroelectric capacitor and overlying interlevel dielectric layers may be formed using the above-described FeRAM process module 104, which includes FeRAM-dedicated process tools 106, shared FeRAM process tools 108, and automated cleaning station 62. In this embodiment, an oxidation barrier first is formed over the standard contacts. Next, the bottom electrode, PZT dielectric, top electrode, and hardmask are deposited. The PZT dielectric may be deposited in one tool and the electrodes and diffusion barriers may be formed in a second tool. Step 112 preferably is performed using FeRAM-dedicated tools 106. At this point, the substrate is transferred to automated cleaning station 62 so that the backside, edge and frontside edge exclusion zone surfaces may be cleaned (step 114). The capacitor stack is patterned in a shared FeRAM process tool 108 (e.g., a lithographic stepper), and the capacitor stack is etched in a dedicated etch tool (step 116). A post-etch clean may be performed, if necessary (step 118). Sidewall diffusion barrier layer 26 may be formed over the etched capacitor stack, preferably in an FeRAM-dedicated tool 106 (step 120). The substrate again is transferred to automated cleaning station 62 so that the backside, edge and frontside edge exclusion zone surfaces may be cleaned (step 122). Silicon nitride etch stop layer 27 and interlevel dielectric layer 32 are deposited over sidewall diffusion barrier layer 26 using FeRAM shared tools 108 (step 124). Contact vias are patterned in FeRAM shared tools 108 and the patterned contact vias are etched through interlevel dielectric layer 32 in FeRAM-dedicated tools 106 (step 126). The substrate then is transferred to automated cleaning station 62 so that the backside, edge and frontside edge exclusion zone surfaces may be cleaned (step 128). Etch recovery and anneal processes and contact/interconnect formation processes are performed in FeRAM shared process tools 108 (steps 130, 132). The substrates then may be processed using industry-standard semiconductor backend processes 134 (step 136).

By allocating certain tools for FeRAM-only processes and other tools for shared processes, and by implementing contamination control process steps before substrates are transferred from FeRAM-dedicated tools 106 to shared tools 108, the above-described process control methodology reduces the risk of cross-contamination by the introduction of ferroelectric device materials, while enabling the production efficiencies of integration of ferroelectric and semiconductor device processes to be realized.

Other embodiments are within the scope of the claims.

For example, in some embodiments, conventional metrology steps may be performed in shared metrology tools, in which case additional contamination control steps should be performed before substrates are transferred from FeRAM-dedicated tools to the shared metrology equipment.

In addition, in some embodiments, the via contact etch step (step 126) may be performed in an FeRAM shared tool. In these embodiments, the subsequent contamination control step (step 128) would not be performed.

Still other embodiments are within the scope of the claims.

What is claimed is:

1. A method of forming a ferroelectric device on a substrate having a top surface, a bottom surface, an edge and a frontside edge exclusion zone, comprising:

forming a bottom electrode over the top surface of the substrate;

forming a ferroelectric dielectric layer over the bottom electrode;

forming a top electrode over the ferroelectric dielectric layer; and selectively etching ferroelectric device material from the entire bottom surface and the edge of the substrate with an etchant consisting of a mixture selected from the following: $HNO_3$ and $H_2O$; HF, HCl and $H_2O$; $NH_4F$, HCl, $HNO_3$ and $H_2O$; and HF, HCl, $HNO_3$ and $H_2O$.

2. A method of forming a ferroelectric device on a substrate having a top surface, a bottom surface, an edge and a frontside edge exclusion zone, comprising:

forming a bottom electrode over the top surface of the substrate;

forming a ferroelectric dielectric layer over the bottom electrode;

forming a top electrode over the ferroelectric dielectric layer; and selectively etching ferroelectric device material from the bottom surface and the edge of the substrate with an etchant comprising a mixture of $NH_4F$ and HCl.

3. The method of claim 2, wherein the etchant comprises a $NH_4F$:HCl volume ratio of about 1.6.

4. The method of claim 2 wherein the etchant consists of $NH_4F$, HCl, and $H_2O$.

5. The method of claim 4, wherein the etchant comprises a $NH_4F$:HCl:$H_2O$ volume ratio of about 1:1.6:x, wherein x has a value ranging from about 40 to about 100.

6. A method of forming a ferroelectric device on a substrate having a top surface, a bottom surface, an edge and a frontside edge exclusion zone, comprising:

forming a bottom electrode over the top surface of the substrate;

forming a ferroelectric dielectric layer over the bottom electrode;

forming a top electrode over the ferroelectric dielectric layer; and selectively etching ferroelectric device material from the bottom surface and the edge of the substrate with an etchant consisting of HF and $H_2O$.

7. The method of claim 1, further comprising selectively etching ferroelectric device material from the substrate frontside edge exclusion zone.

8. A method of forming a ferroelectric device on a substrate having a top surface, a bottom surface, an edge and a frontside edge exclusion zone, comprising:

forming a bottom electrode over the top surface of the substrate;

forming a ferroelectric dielectric layer over the bottom electrode;

forming a top electrode over the ferroelectric dielectric layer; and selectively etching a sacrificial layer disposed over at least the bottom surface and the edge of the substrate to remove ferroelectric device material from the bottom surface and the edge of the substrate.

9. The method of claim 8, wherein the sacrificial layer comprises silicon nitride or silicon dioxide.

10. The method of claim 8, wherein the sacrificial layer is etched with an etchant.

11. The method of claim 10, wherein the etchant comprises fluorine or HF, or both.

12. The method of claim 8, wherein the sacrificial layer extends over the frontside edge exclusion zone of the substrate.

13. A method of forming a ferroelectric device, comprising:

providing a substrate having a top surface, a bottom surface, an edge and a frontside edge exclusion zone, and a sacrificial layer disposed over at least the edge and the bottom surface;

forming a bottom electrode over the top surface of the substrate;

forming a ferroelectric dielectric layer over the bottom electrode;

forming a top electrode over the ferroelectric dielectric layer; and after a ferroelectric capacitor structure has been formed, etching the sacrificial layer to remove ferroelectric device contamination formed thereon.

14. The method of claim 13, wherein the sacrificial layer comprises silicon nitride or silicon dioxide.

15. The method of claim 13, further comprising selectively etching ferroelectric device material from regions corresponding to the bottom surface, edge and frontside edge exclusion zone before the sacrificial layer is etched.

16. A method of forming a ferroelectric device on a substrate having a top surface, a bottom surface, an edge and a frontside edge exclusion zone, comprising:

forming a bottom electrode over the top surface of the substrate;

forming a ferroelectric dielectric layer over the bottom electrode;

forming a top electrode over the ferroelectric dielectric layer; and selectively etching ferroelectric device material from the bottom surface and the edge of the substrate with an etchant consisting of a mixture of $HNO_3$ and $H_2O$.

* * * * *